(12) United States Patent
McKenzie et al.

(10) Patent No.: US 7,615,398 B2
(45) Date of Patent: Nov. 10, 2009

(54) PYRAMIDAL PHOTONIC CRYSTAL LIGHT EMITTING DEVICE

(75) Inventors: James McKenzie, Flushing (GB); Tom Lee, Basingstoke (GB); Majd Zoorob, Southampton (GB)

(73) Assignee: Luxtaltek Corporation, Chunan, Miaoli County (TW)

( * ) Notice: Subject to any disclaimer, the term of this patent is extended or adjusted under 35 U.S.C. 154(b) by 111 days.

(21) Appl. No.: 11/564,207

(22) Filed: Nov. 28, 2006

(65) Prior Publication Data

US 2008/0121912 A1 May 29, 2008

(51) Int. Cl.
  *H01L 21/00* (2006.01)
(52) U.S. Cl. .............................. 438/65; 438/26; 438/27; 438/69
(58) Field of Classification Search .................... 438/29, 438/32, 65, 69, 71, 25–28
See application file for complete search history.

(56) References Cited

U.S. PATENT DOCUMENTS

| | | | |
|---|---|---|---|
| 6,753,643 B2 * | 6/2004 | Wilson | 313/309 |
| 7,385,226 B2 | 6/2008 | Ou et al. | |
| 2003/0218179 A1 | 11/2003 | Koide et al. | |
| 2005/0285132 A1 | 12/2005 | Orita | |
| 2005/0285136 A1 | 12/2005 | Ou et al. | |
| 2006/0062540 A1 | 3/2006 | Zoorob et al. | |
| 2008/0061304 A1 | 3/2008 | Huang et al. | |
| 2008/0121913 A1 | 5/2008 | McKenzie et al. | |

FOREIGN PATENT DOCUMENTS

EP   1526583 A2   4/2005
WO   2006/032865 A1   3/2006

OTHER PUBLICATIONS

International Search Report and Written Opinion, dated Mar. 18, 2008, from related International Application No. PCT/GB2007/004521.
Orita et al., "High-Extraction-Efficiency Blue Light-Emitting Diode Using Extended-Pitch Photonic Crystal," Japanese Journal of Applied Physics, vol. 43, No. 8B, Aug. 2004, pp. 5809-5813.
Ng et al., "GaN nanotip pyramids formed by anisotropic etching," Journal of Applied Physics, vol. 94, No. 1, 2003, pp. 650-653.
Office Action, dated Dec. 11, 2008, from U.S. Appl. No. 11/564,213.

* cited by examiner

*Primary Examiner*—Kevin M Picardat
(74) *Attorney, Agent, or Firm*—McDonnell Boehnen Hulbert & Berghoff LLP

(57) ABSTRACT

A light-emitting device (LED) is described which exhibits high extraction efficiency and an emission profile which is substantially more directional than from a Lambertian source. The device comprises a light generating layer disposed between first and second layers of semiconductor material, each having a different type of doping. An upper surface of the first layer has a tiling arrangement of pyramidal or frustro-pyramidal protrusions of semiconductor material surrounded by a material of different refractive index which together comprise a photonic band structure. The protrusions and their tiling arrangement are configured for efficient extraction of light from the device via the upper surface of the first layer and in a beam that is substantially more directional than from a Lambertian source An enhanced device employs a reflector beneath the second layer to utilize the microcavity effect. A method for fabricating the device is also described which employs anisotropic wet etching to produce the pyramidal or frustro-pyramidal protrusions

6 Claims, 12 Drawing Sheets

Fig 4 cont...
Fig 4E
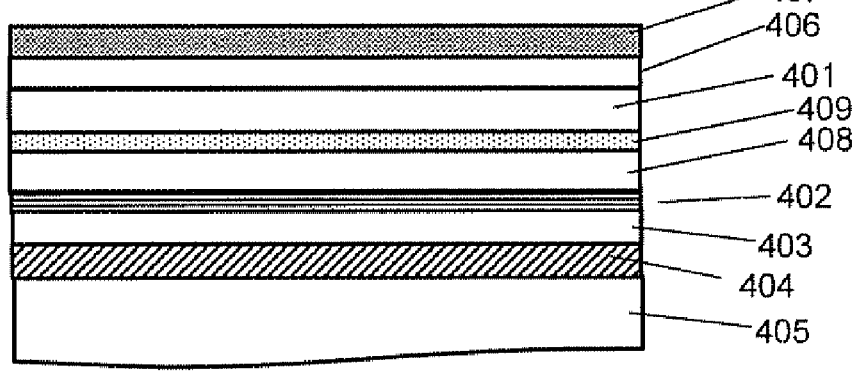
Fig 4F
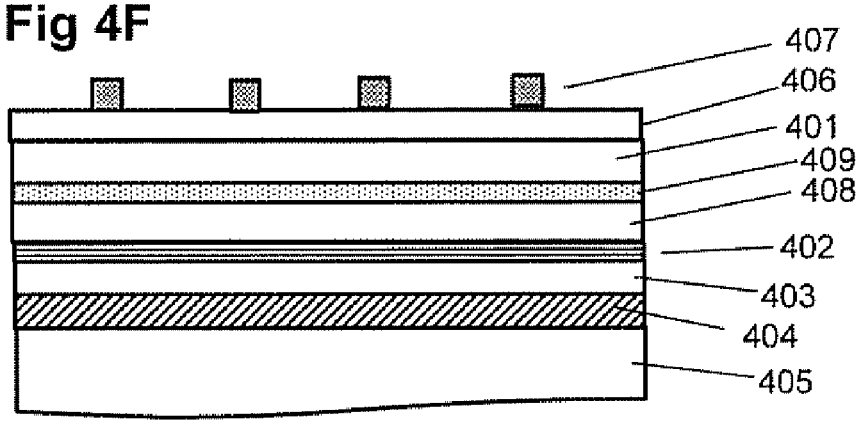
Fig 4G
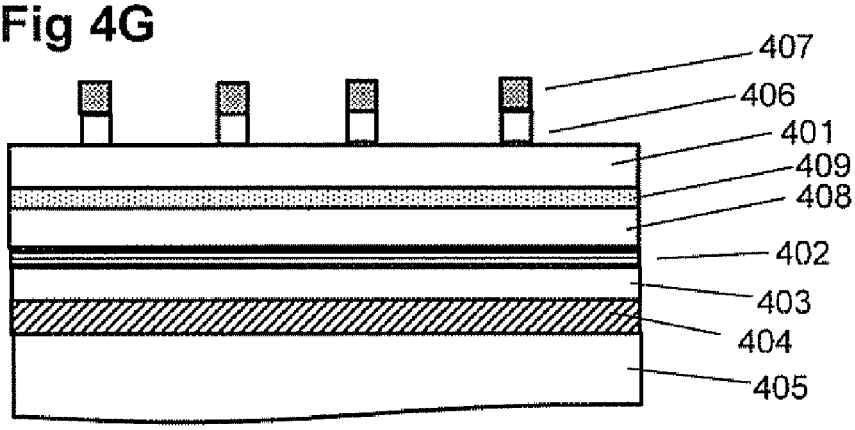

Fig 4 cont...
Fig 4H
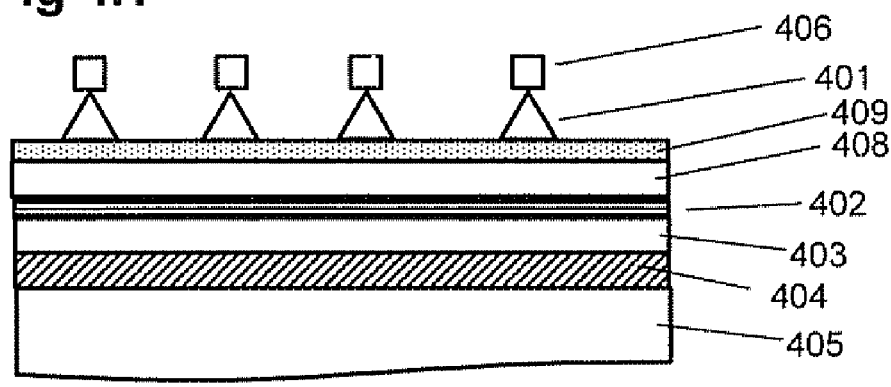
Fig4I
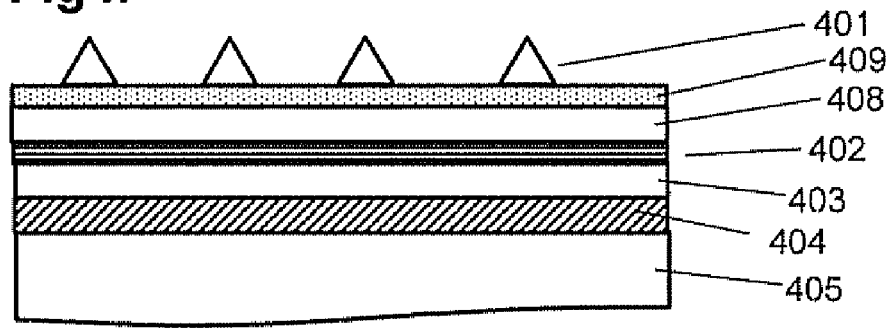

PYRAMIDAL PHOTONIC CRYSTAL LIGHT EMITTING DEVICE

FIELD OF THE INVENTION

The present invention relates to light-emitting diodes with improved light extraction and directionality, and in particular to devices employing photonic crystal structures.

BACKGROUND OF THE INVENTION

Light emitting diodes (LEDs) are based on a forward biased p-n junction and have recently reached sufficiently high brightness levels that they are now suitable for new solid-state lighting applications as well as replacements for projector light sources. Entry into these markets has also been enabled by the economical gains achieved through the high efficiencies of LEDs, as well as reliability, long lifetime and environmental benefits. In particular, applications in solid-state lighting require that LEDs exceed efficiencies currently achievable by alternative fluorescent lighting technologies.

Back Light Units (BLU) for liquid crystal display (LCD) panels are key elements in the performance of an LCD panel. Currently, most LCD panels employ compact cathode fluorescent light (ccfl) sources However, these sources suffer from several problems, including poor colour gamut, environmental recycling and manufacture issues, thickness and profile, high voltage requirements, poor thermal management, weight and high power consumption In order to alleviate these problems LCD manufacturers are implementing LED BLU units. These offer benefits in many areas, including colour gamut, lower power consumption, thin profiles, low voltage requirements, good thermal management and low weight.

Current LED BLU systems distribute LEDs across the back surface of the LED as demonstrated in U.S. Pat. No. 7,052,152. For small displays these are generally low cost designs. However, for larger LCD panels, for example greater than 32 inches, the number of LEDs required to distribute the light evenly across the back of the LCD panel no longer makes this approach cost effective In U.S. Pat. No. 7,052,152 it is proposed that 124 LEDs are employed for a 32 inch LCD panel display.

For some applications, a more isotropic or Lambertian light distribution from an LED is desired and one technique used to achieve this is to roughen the surface through which the light merges. A certain degree of roughness is inherent depending on the LED fabrication process. However, by using techniques such as etching a controlled degree of increased surface roughness can be achieved to improve the scrambling and uniformity of light emerging from the LED.

US2006/0181899 and US2006/0181903 disclose an optical light guide or waveguide arranged to evenly distribute diffused light across the complete LCD panel surface. The light is coupled into the light guide by using side-mounted LED optical sources. Side mounting is beneficial as the number of LEDs required is dramatically reduced per unit area of backlit LCD, when compared with direct LED backlighting. It is proposed that a 32 inch LCD panel can be side lit with as few as 12 LED sources. However, to maximise the light diffused onto the LCD panel the most optimal coupling of the LED light into the light guide is required.

Another area for application of high-brightness LEDs is in light engines for front and rear projectors. Conventional High Intensity Discharge (HID) type projector light engines have always been hindered by low efficiency and short lifetime, resulting in slow adoption into consumer markets. In this particular application the Etendue value of the light source needs to be smaller or matched to the microdisplay Etendue value. This compatibility is very important for improving the overall system efficiency of the complete light projection engine. Additionally, high total luminous outputs and low power consumption are also very important, especially in applications where large rear projection screens (bigger than 50 inch) and front projection systems are required. Low power consumption is desirable in order to minimise thermal management issues Light from a set of red, green and blue single-colour LED sources with small Etendue values are multiplexed to produce the desired colour in the projection system. This eliminates the need for colour wheels and the associated additional costs. The Etendue value E is calculated according to the following equation;

$$E = \pi \times A \times n^2 \times \sin(\alpha)$$

where E is the Etendue of the light source. A is the surface area of the light emission device, and $\alpha$ is the half-angle of the light source. Hence, it can be seen that for projection applications, the degree of collimation of the light emitting source is a key factor and that reducing the half-angle of the source dramatically improves the overall efficiency of the light engine.

The overall efficiency of an LED can be quantified by three main factors, namely internal quantum efficiency, injection efficiency, and extraction efficiency. One of the main limiting factors reducing the efficiency of light extraction from an LED is total internal reflection of the emitted photons and their trapping in the high refractive index of the epi-material forming the LED. These trapped waveguide modes propagate in the LED structure until they are scattered or reabsorbed. The thickness of the LED structure determines the number of modes that can be supported.

U.S. Pat. No. 5,779,924 and U.S. Pat. No. 5,955,749 both describe the use of photonic crystal patterns defined in the semiconductor layers of the LED to affect the way light propagates through the epi-structure. The photonic band structure formed allows the trapped modes to be extracted out and hence increase the extraction efficiency and ultimately the total external efficiency of the LED. The use of photonic crystal structures in an LED is advantageous over other light extraction techniques as they scale with the active surface area of the LED and hence provide an ideal means for improving the light extraction for a large-area high-brightness LED die. The scaling of the LED size is important for solid state lighting applications where absolute luminous output is required. However, the total light extraction for many of these photonic crystal LEDs is not as high as for more conventional surface-roughened LEDs.

U.S. Pat. No. 6,831,302 and US2005/0285132 describe processes for fabricating light-emitting diodes with photonic crystal structures using Gallium Nitride (GaN) based materials. In both cases the processing involves many complex and expensive steps that ultimately affect the yield and cost of the LED wafers. In particular, U.S. Pat. No. 6,831,302 describes a fabrication process that involves the following steps: growing an n-GaN layer on a lattice matched single crystal wafer, an active QW region, and a p-GaN layer, followed by eutectic bonding of a sub-mount or substrate on the top surface, wafer flipping, lift-off from the growth wafer (using a technique such as laser lift-off), surface polishing to provide an optically-smooth surface (using a process such as chemical mechanical polishing), definition of a photonic crystal pattern on the surface (by a process such as nano-imprinting, lithography, or holography), and finally photonic crystal pattern transfer into the GaN material using a suitable dry (e.g. RIE or ICP) or wet etch of the GaN.

One of the complex processing steps involved is the polishing of the wafers, which can adversely affect the yield due to the difficulty in controlling the surface quality across the complete wafer. Small scratches across the surface may affect the current spreading across the LED wafer and ultimately provide a path to short circuiting the complete LED or adversely affecting the forward voltage. Additionally, the thickness of the GaN epi-structure is important for the effective design of the photonic crystal extraction pattern. The high refractive index acts like a highly-multimode waveguide, whereby the thickness determines the number of modes residing in the LED heterostructure. By using a polishing process, poor control over the absolute thickness of the LED structure is achieved, which ultimately affects the overall output of the LED wafers from one processing batch to another. Another complex fabrication step is the definition of small-scale first-order photonic crystal features in the range of 300 nm to 500 nm for the pitch of the features and in the range of 200 nm to 400 nm for the diameter of the hole features. Such patterns are currently defined using either nano-imprinting or holography. The former technique is currently not a proven technique for such small-scale features on LED wafers and only low yields are achieved. In addition, the technique suffers from a higher cost for small manufacturing volumes. The latter lithography technique suffers from complex alignment and stability as well as low volumes.

There is therefore a need for a new type of surface patterned LED, which performs better than conventional surface-roughened or photonic crystal LED device and which can be fabricated in a simple and cost-effective manner.

SUMMARY OF THE INVENTION

According to a first aspect of the present invention, a light-emitting device (LED) comprises:
a first layer comprising a first semiconductor material having a first type of doping;
a second layer comprising a second semiconductor material having a second type of doping; and,
a light-generating layer disposed between the first and second layers,
wherein the first layer has an upper surface distal the light-generating layer and a lower surface proximate the light-generating layer and wherein light generated in the light-generating layer emerges from the LED structure through the upper surface of the first layer, the first layer further comprising a tiling arrangement of pyramidal or frustro-pyramidal protrusions of the first semiconductor material from the upper surface surrounded by a material of different refractive index to the first semiconductor material, wherein the tiling arrangement of protrusions and surrounding material comprise a photonic band structure, and wherein the protrusions and their tiling arrangement are configured such that light emerging from the LED structure through the upper surface is substantially more directional than from a Lambertian source.

A Lambertian source emits a luminous flux per unit solid angle that in any direction is proportional to the cosine of the angle between that direction and the normal to the surface from which it is emitted. This leads to a uniform radiance with a spherical distribution. An LED comprising a structure according to the present invention combines greater directionality of emitted light with an improvement in the efficiency with which light generated by the device is coupled into the emitted beam. This is achieved through the innovative tiling arrangement of pyramidal, or frustro-pyramidal, surface projections.

Three particular classes of photonic tiling arrangements are preferred, namely photonic crystals having both short range and long range order, photonic quasicrystals having short range translation disorder but long range order, amorphous tiling patterns having short range separation order but long range disorder. In the case of amorphous, the separation between neighbouring pyramidal regions is fixed while the rotational symmetry is randomised.

In the present invention a high-order pyramidal photonic crystal or quasicrystal pattern is proposed that provides increased light extraction when compared to more conventional first-order photonic crystal patterns. Careful design of the photonic crystal also allows tailoring of the far-field light pattern produced by the device. In particular, the pyramidal shape of the protrusions with angled side walls and their well-defined tiling arrangement can extract light from the LED in a beam that is more collimated than a from Lambertian source, even for patterns with large lattice constants (>1 µm).

Preferably, the pyramidal protrusions have a size greater than 1.0 µm. However, they may be greater than 1.5 µm or 2.0 µm in size or even greater than 2.5 µm in size. The relatively large pyramid sizes relaxes the tolerances for fabrication and also means that surface polishing is not required prior to formation of the pyramidal protrusions, as their dimensions are sufficiently greater than the residual surface roughness.

Moreover, it is further preferred that the pitch of the tiling arrangement is greater than 1.5 µm, although it may be greater than 2.0 µm or 2.5 µm in size or even greater than 3.0 µm in size.

For many applications, it is preferred that the protrusions are configured such that a significant proportion (>35%) of the light is extracted in a central cone having a 30° half-angle to the vertical axis. Preferably, greater than 37%, 38% or even 40% is extracted in the central cone. This enables efficient and uniform coupling of light into narrow elongated light guides that are often used with light sources for projection applications.

Alternatively, the pyramids and tiling pattern may be configured such that light is predominantly extracted at angles greater than this, in a side-emitting fashion. For example, light may be emitted in a collimated ring or donut-like distribution around the vertical axis, rather than within a narrow central cone. In this case the distribution may be centred at angles greater than or equal to 30°, 40°, 50° or 60° to the vertical, or equivalently at angles less than or equal to 60°, 50°, 40° or 30° to the surface.

The first semiconductor material having the first type of doping may be either n-doped or p-doped, in which case the second semiconductor material having the second type of doping will be either p-doped or n-doped, respectively.

The first layer may comprise a layer of etch stop material embedded at a predetermined depth in the first semiconductor material, in which case the projections formed of first semiconductor material will extend from a surface of the etch stop material layer.

In a particularly preferred embodiment, the first semiconductor material comprises n-doped GaN or InGaN and the second semiconductor material comprises p-doped GaN or InGaN. It is preferred that the light-generating layer comprises a multiple quantum well structure of GaN-InGaN. In terms of pyramid diameter, the higher order photonic crystal dimensions are typically in the range 1.0 µm to 3.0 µm, although this depends on a range of factors, including wavelength, far-field pattern, LED thickness and location of the multiple quantum well structure within the overall GaN heterostructure. Suitable etch stop materials include AlGaN and InGaN.

To enhance light extraction still further it is preferred that the LED further comprises an optical reflector to reflect light propagating away from the upper extraction surface of the first layer and which would otherwise not be extracted. The optical reflector is disposed adjacent the second layer of the second semiconductor material such that the second layer is located between the light-generating layer and the reflector.

Preferably, the optical reflector comprises a simple layer of a metallic material or it may comprise a multi-layer dielectric structure. Alternatively, the optical reflector may comprise a distributed Bragg reflector (DBR) or an omni-directional reflector (ODR).

Preferably, a separation distance between the light-generating layer and the optical reflector is such as to comprise a microcavity which enhances the amount of generated light propagating towards the upper extraction surface of the first layer. The microcavity effect gives an even greater enhancement in extraction efficiency over and above that provided by simple reflection at the optical reflector. An optimal separation is between 0.5 to 0.7 times the wavelength of light generated in the light-generating layer. When a microcavity is present, it is preferred that the pyramidal protrusions and their tiling arrangement are configured to cooperate optimally with the microcavity effect to further enhance the efficiency of light extraction from the LED.

The LED described above is suitable for application in solid-state lighting sources, including those for front and rear projectors.

Therefore, according to a second aspect of the present invention, a light engine for an optical projector unit comprises a plurality of light emitting devices according to the first aspect.

According to a third aspect of the present invention, a method for fabricating a light-emitting device (LED) according to the first aspect comprises the steps of:

providing a light-emitting device heterostructure comprising a first layer comprising a first semiconductor material having a first type of doping, a second layer comprising a second semiconductor material having a second type of doping, and a light-generating layer disposed between the first and second layers, wherein the first layer has an upper surface distal the light-generating layer and a lower surface proximate the light-generating layer and wherein light generated in the light-generating layer emerges from the LED structure through the upper surface of the first layer, forming an etch mask on the first layer, the mask comprising islands of mask material at locations corresponding to a predetermined tiling arrangement, wherein the step of forming the mask comprises the steps of:

depositing a layer of photoresist over the first layer;

patterning the photoresist by exposure according to the predetermined tiling arrangement; and, removing unexposed photoresist to leave islands of photoresist at locations corresponding to the predetermined tiling arrangement;

forming pyramidal or frustro-pyramidal projections of the first semiconductor material in the first layer at locations beneath the islands of mask material by anisotropically wet etching the first semiconductor material to a predetermined depth along predetermined crystal planes; and, removing the islands of mask material to leave behind the predetermined tiling arrangement of pyramidal or frustro-pyramidal projections, which in combination with a surrounding material of different refractive index comprise a photonic band structure.

The light-emitting device heterostructure itself may be fabricated by any suitable known process, including flip-chip processes.

The layer of photoresist may itself be the mask layer, in which case the islands of mask material are the islands of photoresist. Any suitable process for patterning the photoresist by exposure may be used, including UV lithography. The un-exposed photoresist is removed using a suitable developer and the remaining exposed islands of photoresist removed by stripping. A variety of etchants are available for the anisotropic wet etch, including solutions of KOH, NaOH or $H_3PO_4$.

Alternatively, a harder mask material may be employed, which is etch-resistant to the anisotropic wet etch.

Preferably, the step of forming an etch mask further comprises the steps of:

depositing a layer of hard mask material over the first layer before the step of depositing the layer of photoresist;

removing hard mask material after the step of removing photoresist to leave islands of hard mask material beneath the islands of photoresist; and, removing the remaining islands of photoresist to leave behind the etch mask comprising the islands of hard mask material at locations corresponding to the predetermined tiling arrangement.

Suitable hard mask materials include $SiO_2$ or $Si_3N_4$ deposited by PECVD or a metal deposited by sputtering or evaporation. Once the pyramidal protrusions have been formed, the remaining islands of hard mask material are removed by a suitable wet or dry etch process.

The depth of the anisotropic etch will determine whether frustro-pyramidal or pyramidal projections are formed and also their size. However, precise control of the anisotropic etch depth may be difficult, if based on speed of etch and etch time. Therefore, an etch stop may be employed to ensure etching is terminated at a particular depth.

Preferably, the first layer of the light-emitting device heterostructure comprises a layer of etch stop material embedded at the predetermined depth in the first semiconductor material. The anisotropic etch of the first semiconductor material will then continue until the layer of etch stop material is reached, thus providing greater uniformity and repeatability of the fabrication method.

Thus, the present invention also provides a simplified method of manufacture of a photonic crystal type LED structure, whereby the definition of a large feature photonic crystal is transferred onto an LED by the use of low cost photolithography or similar process and without the need for complex polishing processes.

BRIEF DESCRIPTION OF THE DRAWINGS

Examples of the present invention will now be described in detail with reference to the accompanying drawings, in which:

FIGS. 4E to 4I illustrate the additional manufacturing steps for fabricating a pyramidal photonic crystal structure in the upper layer of the device shown in FIG. 4D;

DETAILED DESCRIPTION

An aim of the present invention is to provide improved light extraction as well as tailored far-field emission from light emitting devices. These devices can employ a wide range of light emitting semiconductor material system including, but not restricted to, InGaN, InGaP, InGaAs, InP, or ZnO. The description will focus on the implementation of the directional light extraction technique implemented in green InGaN light emitting devices. However, the design can be equally optimised and implemented for other emission wavelengths (such as blue or UV) using this material as well as for other material systems, such as InGaP which is suitable for red and yellow wavelengths.

In a preferred implementation of the invention a novel high-order pyramidal photonic crystal (PC) or quasicrystal pattern is proposed that provides increased light extraction, as compared to first-order photonic crystal patterns. The PC design also allows for the tailoring of the far-field light distribution emitted by the devices. The pyramidal shape of the PC sub-regions and their well defined tiling arrangement permits extraction of light from the device in a beam which is more collimated than from a Lambertian source. A simplified process for manufacturing the device will also be described.

In terms of pyramid diameter, the higher-order PC dimensions are greater than 1.0 µm in size and may be greater than 1.5 µm or 2.0 µm, and can be up to, but not limited to, 3.0 µm, 3.5 µm and 4.0 µm in size. This varies depending on the far-field pattern, the LED thickness and the location of the quantum wells within the light-generating region of the GaN heterostructure.

Figure 1:
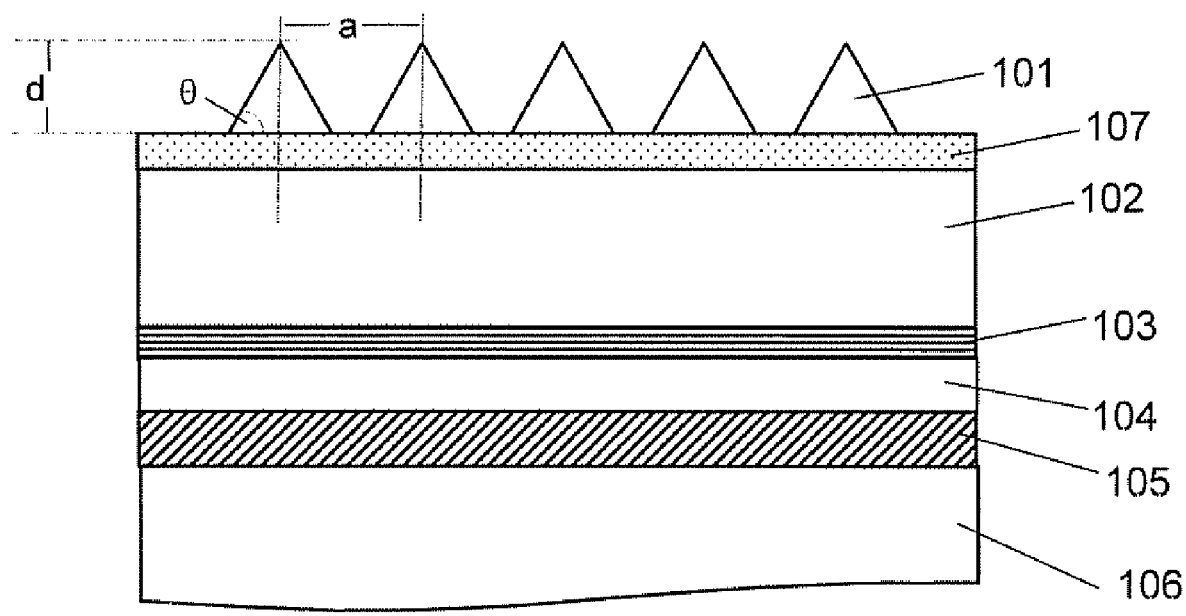
FIG. 1 shows a cross section of the proposed device.

FIG. 1 demonstrates a cross section of the proposed light emitting device, which comprises pyramids 101 etched in the n-doped GaN or InGaN layer in a periodic, quasicrystalline, amorphous or other complex ordered or repeating tiling arrangement. The pyramidal tiling arrangement is designed to provide dispersion bands that allow trapped light to couple into the Bloch modes of the photonic crystal. Once the light is coupled into the Bloch modes, the photonic crystal provides a means of coupling the light out into free space.

The device shown in FIG. 1 comprises a light-emitting heterostructure, which includes an n-GaN or InGaN top layer 102 and a lower p-type GaN or InGaN layer 104 with a multiple quantum well (MQW) structure 103 residing between these layers. Beneath the p-type layer 104, a reflector layer 105 is present, which can be in the form of a metal reflector such as silver or in the form of a DBR or omni-directional reflector (ODR). The light emitting structure is supported by a carrier substrate or mount, 106. In a preferred embodiment, the carrier substrate comprises an electrically conductive material with a high thermal conductivity such as metal or metal alloy or alternatively Silicon or Silicon Carbide. In another preferred embodiment there exists an etch stop layer, 107, formed from materials such as AlGaN, InGaN, although not limited to these, which allows precise control of the depth of the pyramids. This layer is embedded in between n-type layers 101 and 102.

There are three primary classes of photonic tiling arrangements, which are preferred in the present invention, and in which the arrangements possess the following properties: short range and long range order, namely photonic crystals; short range translation disorder but possess long range order, namely photonic quasicrystals; and short range separation order and long range disorder, namely amorphous tiling arrangements. In the case of an amorphous arrangement, the separation between neighbouring pyramidal regions is fixed while the rotational symmetry is randomised.

These classes of patterning can also comprise of repeating cells of the above-mentioned tiling arrangements. Additionally, they can comprise of regions with defects, that is to say regions where pyramids are removed or the shape or size of the pyramids is modified. The sub-regions may also comprise of pyramids with unetched sharp apex regions, giving rise to flat-top (frustro) pyramids.

The patterning can be characterised by a number of parameters, including the pitch a of the lattice defined as the distance separating the centres of two neighbouring pyramids, and the angle θ formed between the pyramid crystallographic exposed face and the horizontal crystal plane of the GaN lattice. In one aspect of the invention an etch stop layer, 107, is used to control the etch depth. This allows the accurate control of the pyramid diameter at the base. For a given etch depth, d, the diameter Φ of the base of the pyramids is:

$$\Phi = 2 \times d / \tan(\theta)$$

One of the main aspects of the present invention is the use of large features that are crystallographically aligned to provide maximum pattern reproduction accuracy as well as relaxed positional accuracy.

Figure 2A:
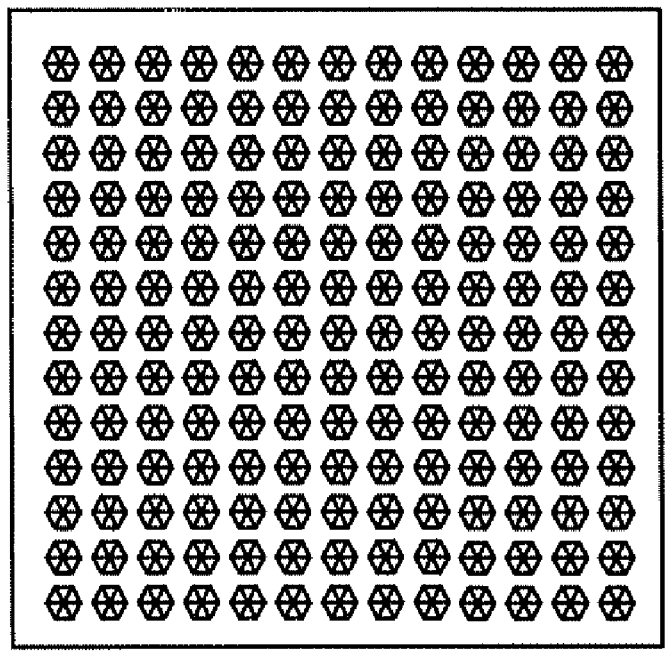
FIG. 2A shows pyramids arranged in a regular square lattice.
Figure 2B:
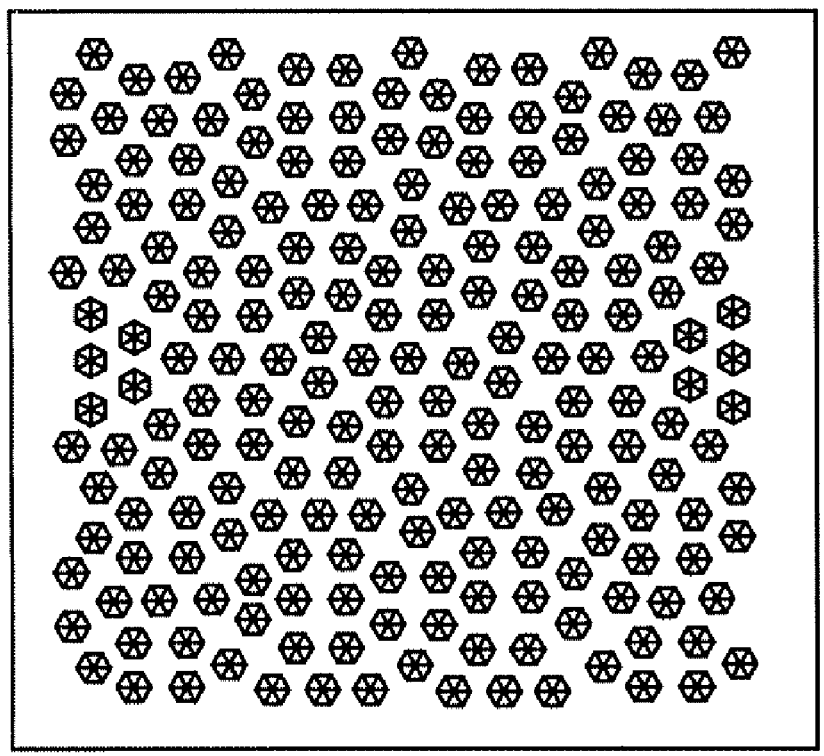
FIG. 2B shows pyramids arranged in a 12-fold quasicrystal.

The hexagonal pyramids (that are formed in c-plane GaN) can be arranged in a regular pattern, quasicrystalline pattern, amorphous pattern or other suitable arrangement. An example is shown in FIG. 2A where the hexagonal pyramids are arranged in a regular square lattice to form a photonic crystal FIG. 2B shows pyramids arranged in a 12-fold symmetric square-triangle quasicrystal tiling to form a photonic quasicrsytal.

An enhanced version of the invention employs an optical reflector placed somewhere below the light emitting region to reflect downward propagating light in the upward direction. Moreover, the separation distance between the light emitting region and the reflector is designed to enhance upward emitting light due to the so-called microcavity effect. The pyramidal photonic crystal is then optimised in conjunction with the microcavity effect to further enhance light extraction. As described by Shen in Appl. Phys. Lett. 82, 14, 2221, 7 Apr. 2003, the following equations describe the relative power intensity at the top surface of an LED as a function of the separation distance between the QW regions and the reflector:

$$E^2 = w_0^2 + w_r^2 + 2w_0 w_r \cos(\pi + \phi + \phi')$$

$$\Phi' = 2\pi(2d \cos(\theta))/\lambda_n$$

where the relevant parameters are as follows:
- $w_0$=amplitude of emitted light;
- $w_r$=amplitude of reflected light;
- $\Phi$=phase shift upon reflection on the mirror; and,
- $\Phi'$=phase shift due to path length difference between emitted light and reflected light, which varies with the separation distance between the microcavity and the QW as well as the incident angle and wavelength in the LED material.
- $\theta$=emission angle relative to the normal.

Figure 3:
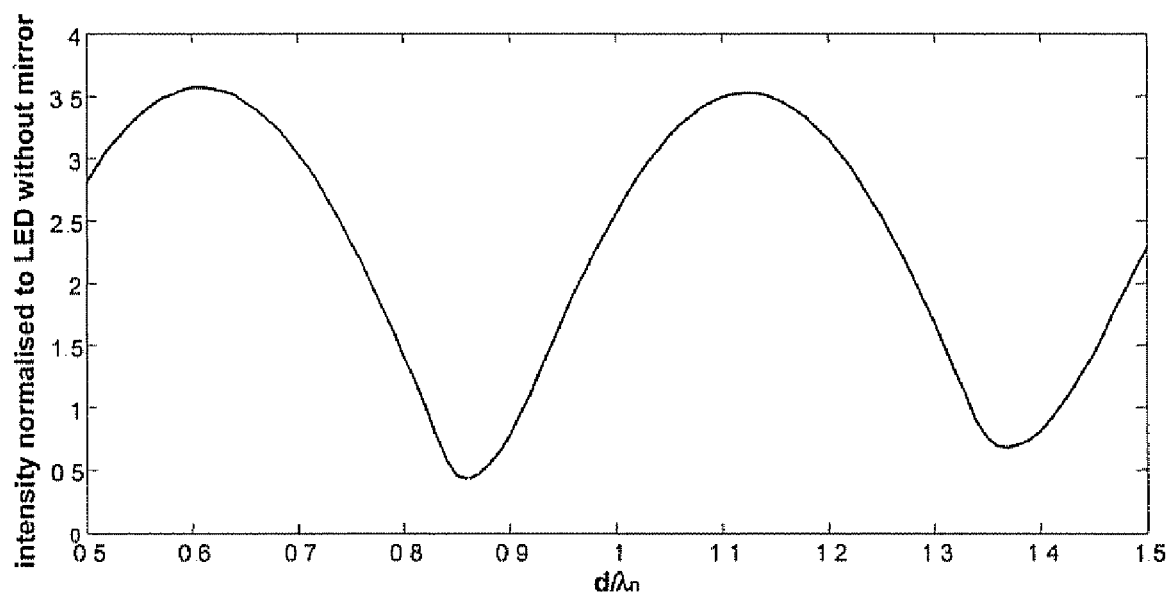
FIG. 3 shows normalised light intensity of a GaN LED as a function of quantum well to mirror separation distance.

To illustrate the micro-cavity effect, FIG. 3 shows a plot of the intensity of the light obtained from an GaN LED device with a mirror as a function of the quantum well to mirror distance. The intensity is normalized to that obtained from a GaN LED without a mirror, thereby illustrating the enhancement. For simplicity, the mirror is assumed to have 100% reflectivity. It is evident that a maximum of approximately 3.5 times more light is extracted when compared to a bare flat GaN light emitting device without a reflector. With respect to the contribution from the reflector alone this amounts to approximately 1.75 more light extracted due to the microcavity effect. Placing the quantum wells at the right distance from the mirror is critical to obtain maximum extraction efficiency in an LED.

The microcavity effect also introduces deviations in the far-field radiation shapes of the LED when compared to that of a Lambertian source. In the context of the current invention, the increased lobe emission can be optimised in conjunction with the top surface photonic crystal pattern, thereby enabling greater light extraction as well as directionality from the LED than would be expected from employing the two extraction techniques separately. The microcavity effect reduces the isotropy of the emission inside the heterostructure, thereby allowing light incident internally onto the photonic crystal to be more collimated.

Due to the high aspect ratio features and large dielectric contrast that the photonic bandstructure offer, it is possible to efficiently overlap the LED waveguide modes with the dispersion bands of the photonic bandstructure to allow strong coupling between them. However, in the case of an isotropic emission inside a thick core LED, many waveguide modes are set up. In this case, the dispersion bands of the photonic crystal cannot be designed to overlap with all the trapped modes. However, by collimating the light using the microcavity, the number of waveguide modes that are set up is reduced. Subsequently, the photonic bandstructure can be optimally designed to extract efficiently the more closely spaced and lesser number of modes trapped in the LED.

Figure 4A:
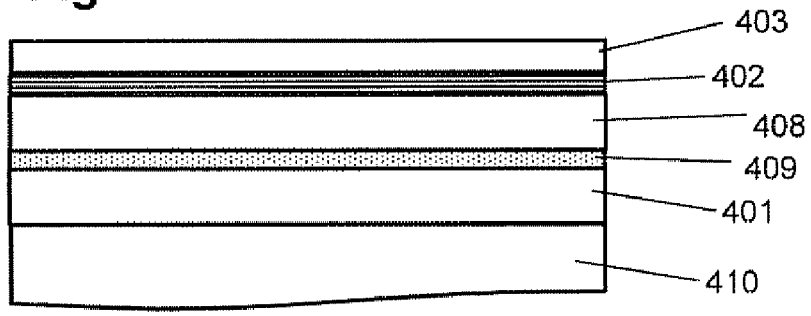
FIGS. 4A to 4D illustrate a Flip Chip-based manufacturing process for fabricating a light emitting device.

A further aspect of the present invention is a simplified method of manufacture of a photonic bandstructure LED of the type described above. A possible manufacturing process is shown in FIGS. 4A to 4I. Initially, an n-doped GaN or InGaN layer 401 is grown by metal-organic chemical vapor deposition (MOCVD) or other similar techniques (such as MBE) on a lattice matched substrate 410. Common substrates used are Sapphire, GaN and SiC. In a preferred embodiment of the invention, an etch stop layer 409, formed from a material such as InGaN or AlGaN is embedded in the n-GaN layer. The n-GaN or InGaN layer growth is continued as layer 408 above the etch stop. Multiple GaN-InGaN quantum wells 402 are grown followed by a p-type GaN layer 403 The complete LED heterostructure stack produced at this stage is shown in FIG. 4A.

Figure 4B:
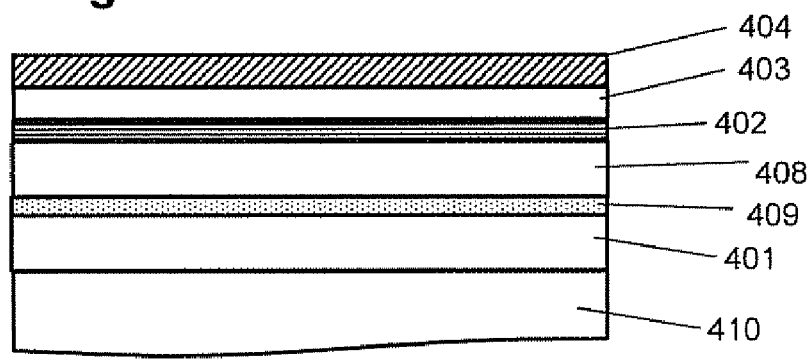

A mirror 404 is then deposited on top of the p-GaN layer 403 as shown in FIG. 4B. The reflector can be metallic comprising a layer of suitable metal, such as silver or gold, deposited by sputtering or evaporation. Alternatively, the reflector may comprise of a dielectric multi-layer stack in the form of a distributed feedback reflector (DBR) or omni-directional reflector (ODR). Such structures can be deposited by sputtering using techniques such as PECVD.

Figure 4C:
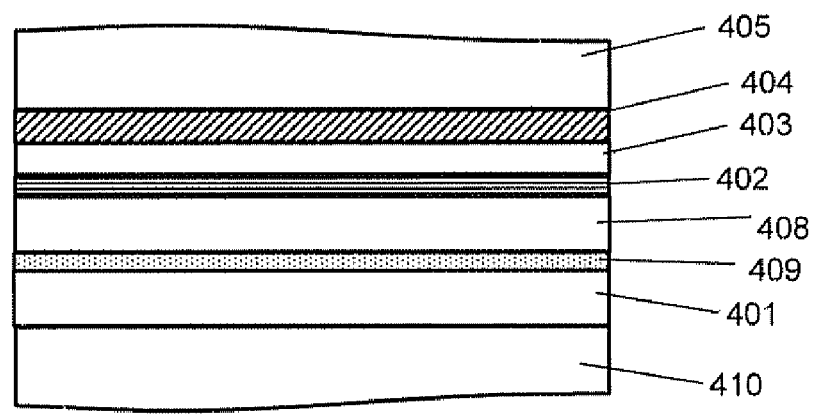

AS shown in FIG. 4C, the heterostructure of FIG. 4B is then bonded to a substrate 405 The substrate 405 is preferably a metal alloy as it allows good thermal and electrical conductivity, but can comprise of other materials such as SiC or Si Prior to the bonding operation, additional layers may be deposited on the mirror 404 to aid with the bonding process.

Figure 4D:
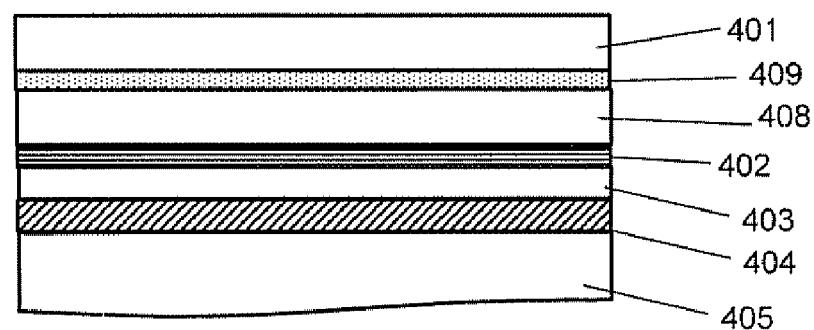

In the final conventional fabrication step, the Sapphire substrate 410 is then removed using laser lift off or other similar technique to give the heterostructure shown in FIG. 4D. Such a structure might form a final complete conventional device, although the etch stop layer would typically be absent. The laser lift-off process leaves the surface of the n-GaN layer 401 rough (typically of the order of 50 nm to 300 nm). In a more conventional device, this surface might be roughened further to improve light extraction. In one aspect of the invention, the dimensions of the photonic bandstructure pyramids are large compared to the surface roughness and hence there is no need for polishing the surface prior to patterning.

FIGS. 4E to 4I show the additional process steps required to fabricate a device according to the present invention, as shown in FIG. 4I.

FIG. 4E shows the deposition of the masking layers. In particular is shown an optional method step, whereby a hard mask layer 406 is deposited for subsequently transferring the desired pattern into the n-GaN layer 401. This can comprise of $SiO_2$ or $Si_3N_4$ deposited by PECVD or it can be a metal deposited by sputtering or evaporation. A layer of photoresist 407 is then deposited on the hard mask 406. However, in some circumstances, the hard mask layer could be dispensed with and the layer of photo-resist 407 deposited directly onto the n-GaN layer 401.

Due to the large size of the pyramidal features, the photoresist 407 may be exposed using standard UV lithography to pattern it with the desired tiling arrangement. The transverse shape of the exposed regions might correspond to the cross-sectional shape of the desired pyramids, or else may be simpler shapes, such as square. The exposed photoresist is then developed leaving behind isolated islands of material corresponding to the desired positions of the vertices of the pyramids, as shown in FIG. 4F. If the hard mask 406 is present, it is then dry etched using RIE, ICP or a similar process. This step transfers the patterning from the photoresist 407 to the hard mask 406, as shown in FIG. 4G. The remaining photoresist 407 is then stripped.

Following this, the n-GaN layer 401 is crystallographically wet etched using a anisotropic wet etch, as shown in FIG. 4H. A preferred method of wet etching GaN is by using KOH solution at concentrations ranging from 1M to 8M with a bath temperature ranging from room temperature to 100° C. Etching times range around approximately 45 minutes. Alternative wet etchants comprise NaOH or $H_3PO_4$.

The crystal faces of the hexagonal pyramids that are formed by the etching process are the {10-1-1} planes of the GaN crystal. They form an angle of 58.4° with the base of the pyramids. The presence of the etch stop layer 409 allows accurate control of the height and therefore also the base diameter of the pyramids. Finally, if a hard mask 406 is utilised, it is then removed using a suitable wet or dry etching process, leaving the final structure shown in FIG. 4I.

Figure 7A:
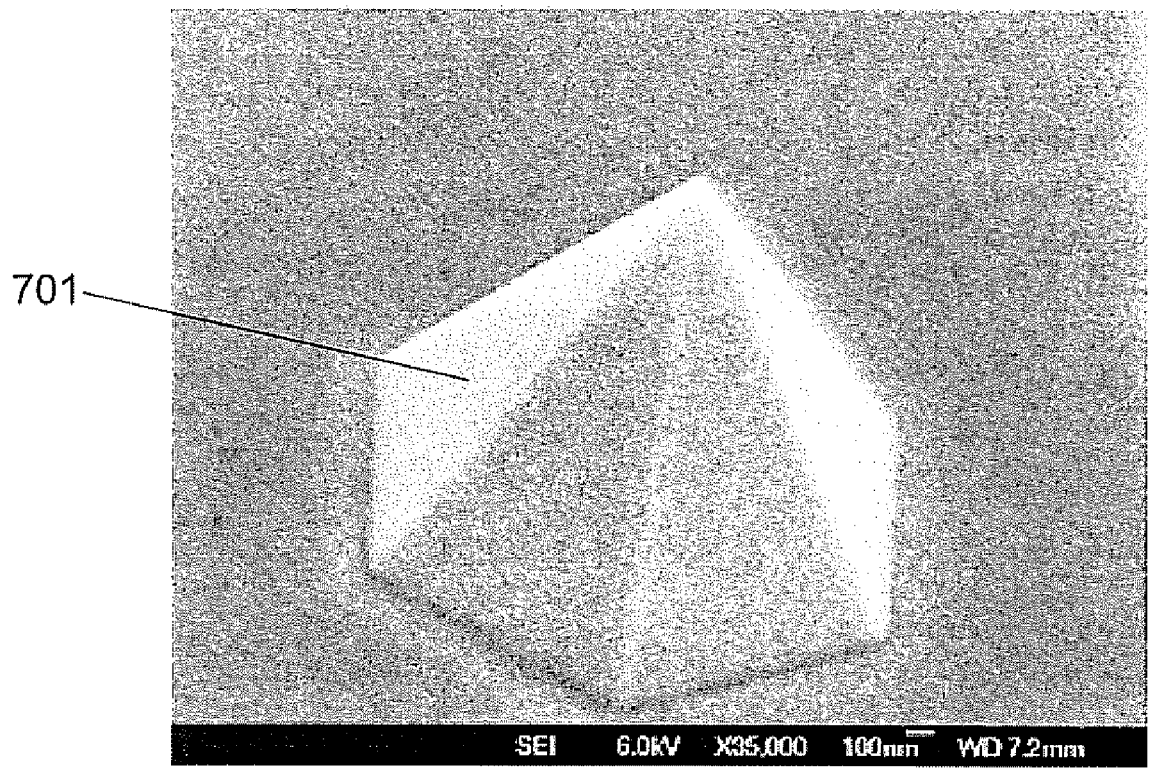
FIG. 7A shows an SEM micrograph of an isolated pyramid formed using the fabrication method of the invention.
Figure 7B:
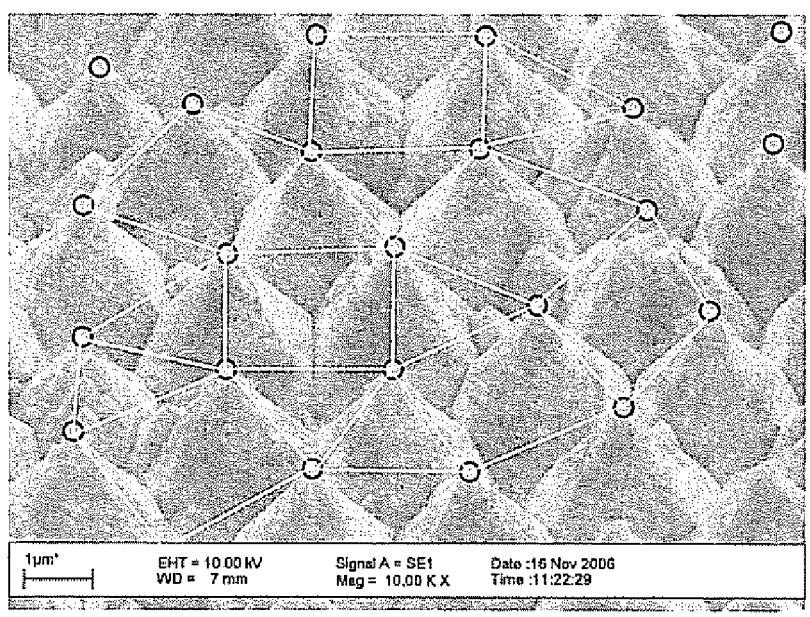
FIG. 7B shows an SEM micrograph of a photonic quasicrystal arrangement of pyramids formed using the fabrication method of the invention.

FIG. 7A shows an SEM micrograph of one of the pyramids produced by this process. In this case, the pyramid is isolated and is formed using the preferred fabrication embodiment, with the crystal {10-1-1} facet shown at 701. FIG. 7B shows an SEM micrograph of a photonic quasicrystal tiling of such pyramids, which have been etched in the top surface of the n-GaN using the preferred fabrication technique. The pyramids are arranged in a square-triangle tiling and the constructions lines shown in FIG. 7B demonstrate the underlying tiling squares and triangles, while the circles highlight the vertices of the quasicrystal pattern.

In the preferred embodiment, the composite n-GaN upper region comprising layers 401, 409 and 408 is located above the light emitting structure. Thus, light is emitting from layer 402 and experiences multiple internal reflections before finally escaping through region 401.

A thick n-GaN growth region is necessary to reduce the defect density for the formation of high-quality quantum well (QW) layers and hence improve internal quantum efficiency of the LED. For manufacturing benefits the upper region (layers 401, 409 and 408) acts as a protection layer for the fragile QW region 402, preventing damage during wet etching of the pyramids and minimising surface recombination in the QW region. Etching into the QW region also adversely affects the total luminous output of the LED by reducing the maximum active light emission area.

Additionally, with respect to optical extraction improvement, the pyramid dimensions required are of the order of 1.75 μm in diameter centred on a pitch of 2.5 μm. The dimensions limit the minimum thickness of the layer 401 and hence it is preferred for the pyramids to reside in the thick n-GaN layer. Also, for improved light extraction, reducing the total thickness of the waveguiding region in the LED by etching reduces the number of trapped modes residing in the heterostructure. This allows the photonic bandstructures to overlap a larger percentage of the trapped modes thereby yielding improved light extraction as shown in FIG. 8. Additionally, n-GaN is also highly conductive and this property minimises the need for separate electrical current spreading layers to be deposited on the top surface of the photonic bandstructure, which would adversely affect light extraction from the device.

Figure 5A:
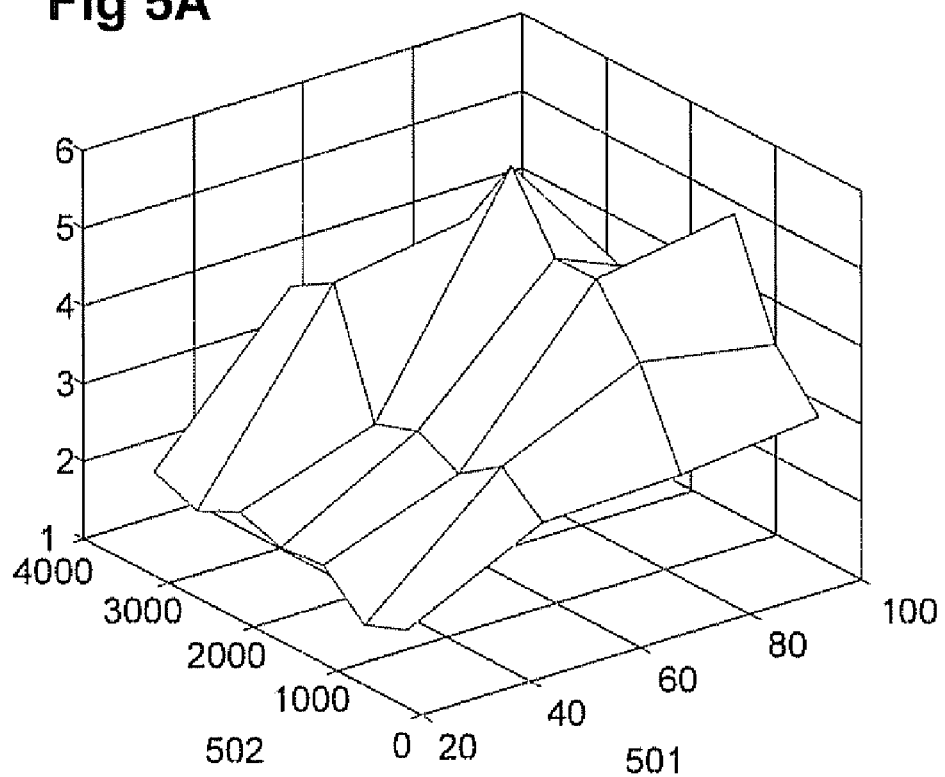
FIG. 5A shows the enhancement in light extraction in a 30° cone for a pyramidal PC-LED as compared to an un-patterned device.
Figure 5B:
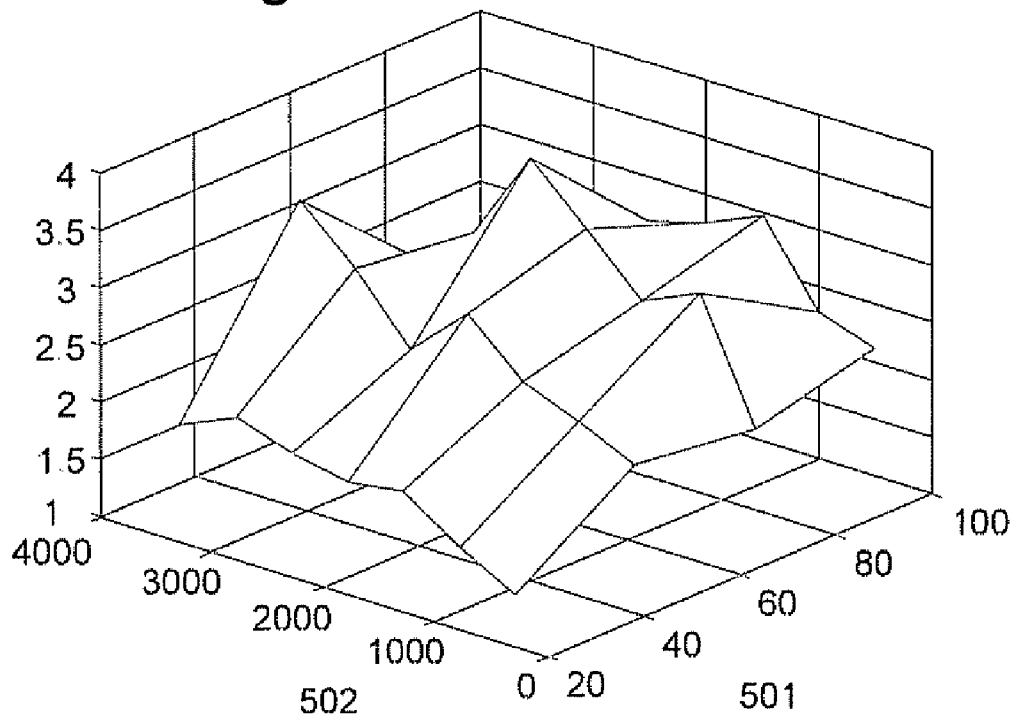
FIG. 5B shows the enhancement in total light extraction for a pyramidal PC-LED as compared to an un-patterned device.
Figure 5:
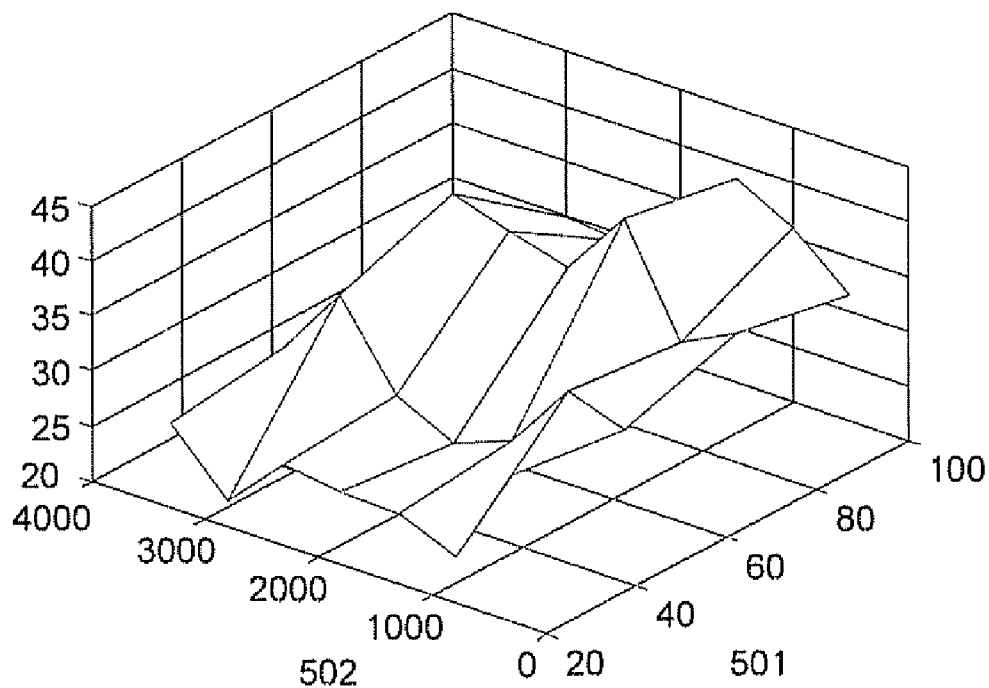
FIG. 5C shows the percentage of light in the 30° cone for different pyramidal photonic crystal light emitting devices.

The results of numerical simulations are shown FIGS. 5A, 5B and 5C, demonstrating the performance of typical pyramidal photonic bandstructures devices. The z-axis shows the total extraction enhancement factor compared to an unpatterned LED with a reflector. The results are plotted along the x-axis 501 as a function of the fill fraction (in %) and along the y-axis 502 as a function of the pitch of the photonic bandstructure (in nm). The fill fraction is defined as diameter/pitch*100.

FIG. 5A shows the extraction enhancement in a central 30° cone for a pyramidal photonic crystal, as compared to an un-patterned LED with a bottom reflector, as a function of lattice constant a and fill fraction. The results show a maximum enhancement of 5.45 for a pitch of 2500 nm and a fill fraction of 75%, and with an optimized microcavity design located beneath the QW region residing at a position of d=0.6/ $\lambda_n$-131 nm. These parameters amount to a device with pyramid diameters approx 1.9 μm spaced on a 2.5 μm pitch.

The simulations were carried out using a 2D Finite Difference Time Domain method. It is important to note that these simulations do not incorporate the numerical discrepancy in converting from 2D to 3D simulations in space and hence experimental results are expected to provide even larger extraction values.

FIG. 5B shows the total extraction enhancement compared to an un-patterned LED with a bottom reflector as a function of lattice constant and fill fraction. The results highlight that, as in FIG. 5A, the optimal operation range appears at a pitch of 2500 nm and a fill fraction of 75%, with an optimized microcavity design located beneath the QWs.

Finally, FIG. 5C demonstrates the percentage of light in the 30° cone for a device with a pyramidal photonic crystal structure. As can be seen, up to 45% of the light emitted by the device can be directed in the central cone having a half-angle of 30° perpendicular to the surface of the device. This amounts to 84% more light in a directional cone as compared to a Lambertian light emitting device. The increased directionality is attributed to the ordered arrangement of pyramids as well as the well defined angle sidewalls of the pyramids. The angled sidewalls provide approximately 30% more light in the 30 degree cone compared to regular straight sidewall, etched, air rod photonic crystal LEDs.

Figure 6A:
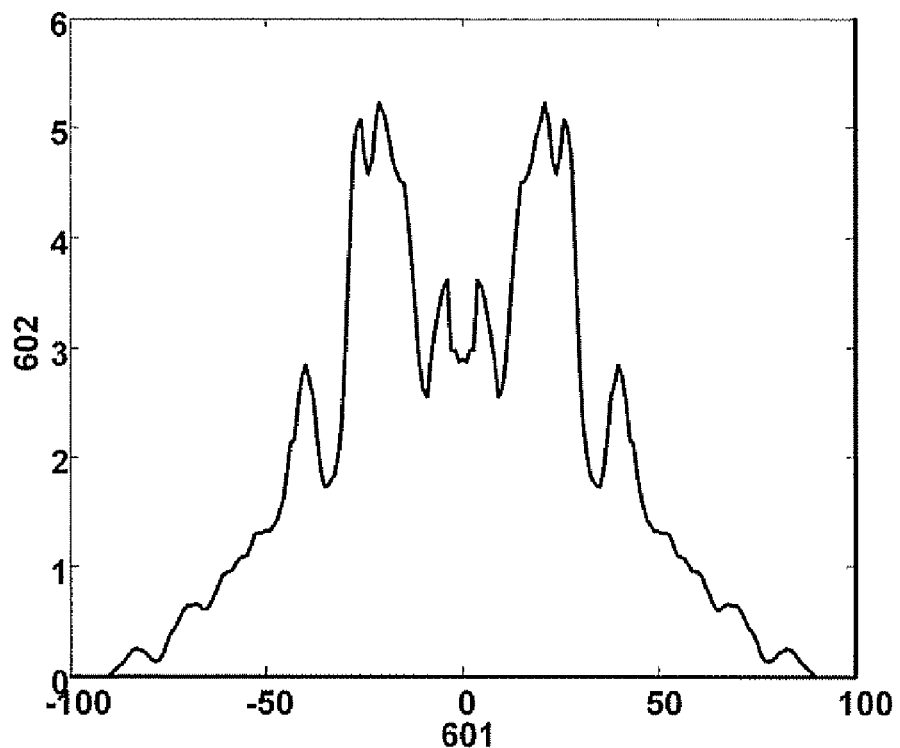
FIG. 6A shows the far-field pattern for a PC-LED structure according to a preferred embodiment of the invention.
Figure 6B:
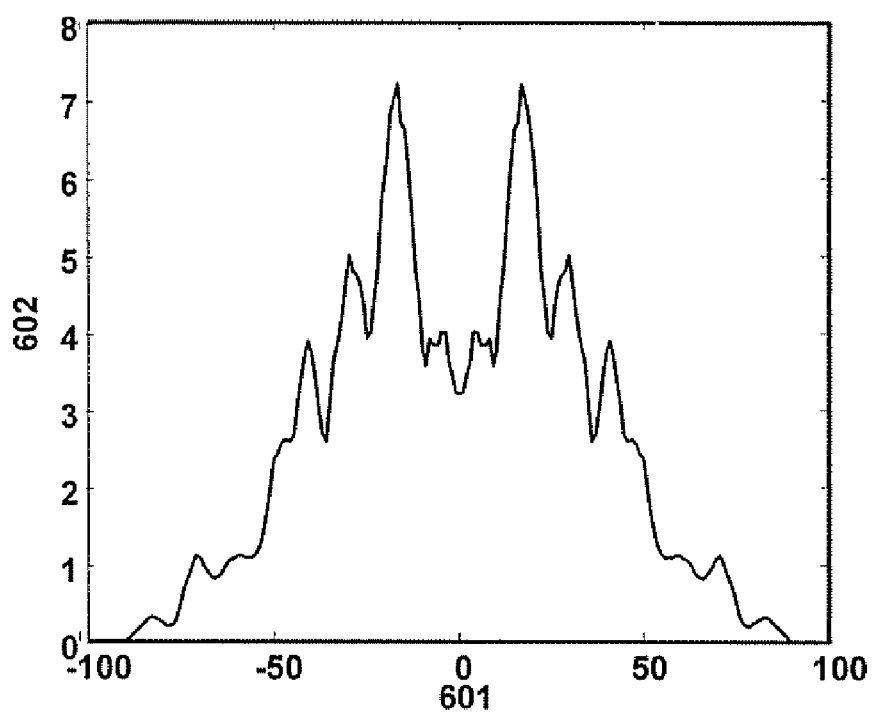
FIG. 6B shows the far-field pattern for a PC-LED structure according to another preferred embodiment of the invention.

FIGS. 6A and 6B are cross-sections through the light distribution in a plane, which shows representative far-field patterns. The result is plotted as a function of far field angle 601 along the x-axis and indicates and the light intensity 602 is normalized to that from an un-patterned LED with a bottom reflector. The far-field pattern is referenced with respect to the perpendicular to the LED surface. FIG. 6A shows the far-field pattern for an LED with a lattice constant of 1500 nm and pyramid diameter of 1120 nm, which gives a total extraction enhancement of ×2.67 over and above a light emitting device with a reflector and an optimized microcavity. The enhancement in the 30° cone is ×4.57 and the 30° cone contains 40.5% of the total light extracted light.

FIG. 6B shows the far-field pattern for an LED with a lattice constant of 2500 nm and pyramid diameter of 1870 nm, which gives a total extraction enhancement of ×3.61 over and above a light emitting device with a reflector and an optimized microcavity. The enhancement in the 30° cone is ×5.45 and the 30° cone contains 35.8% of the total light. This amounts to 46% more light in a directional cone, as compared to a Lambertian light-emitting device.

Table 1 below shows a comparison of the light emitted in a narrow 30° cone angle as a percentage of the total light emitted, for the same green GaN LED configured as a simple Lambertian emitter, as a first-order photonic crystal LED comprising etched air rods, and as a pyramidal photonic crystal LED comprising etched pyramids. In the case of the photonic crystal devices, the dimensions were optimized to extract the maximum percentage of light in the 30° cone. The first-order photonic crystal dimensions comprised a lattice air rods with pitch 350 nm, air-rod diameter approximately 210 nm and an etch depth of around 120 nm, while the pyramidal photonic crystal dimensions were as described above.

TABLE 1

| Device Type | Lambertian LED | Photonic Crystal LED | Pyramidal photonic crystal LED |
| --- | --- | --- | --- |
| Percentage light in 30° cone | 24.9 | 34.9 | 45.0 |

As can be seen an increase in directionality is obtained as a more optimal structure is employed.

Figure 8A:
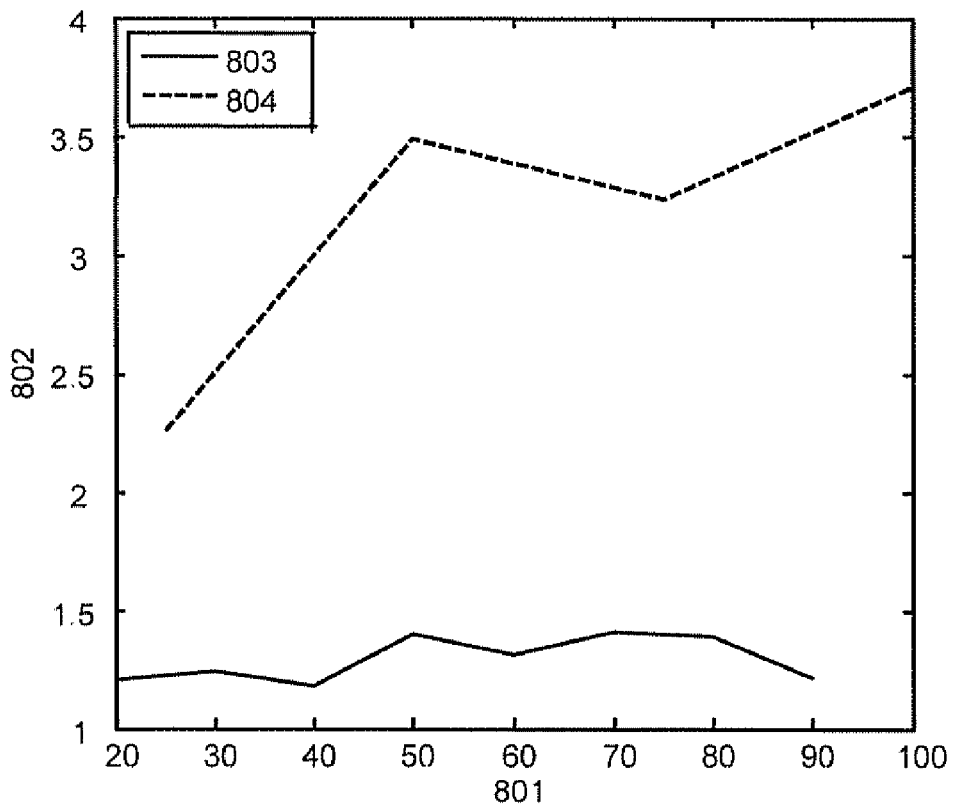
FIG. 8A is a plot of light extraction enhancement versus photonic crystal fill fraction for a conventional PC-LED and for a pyramidal PC-LED with micro-cavity compared to an un-patterned LED.
Figure 8B:
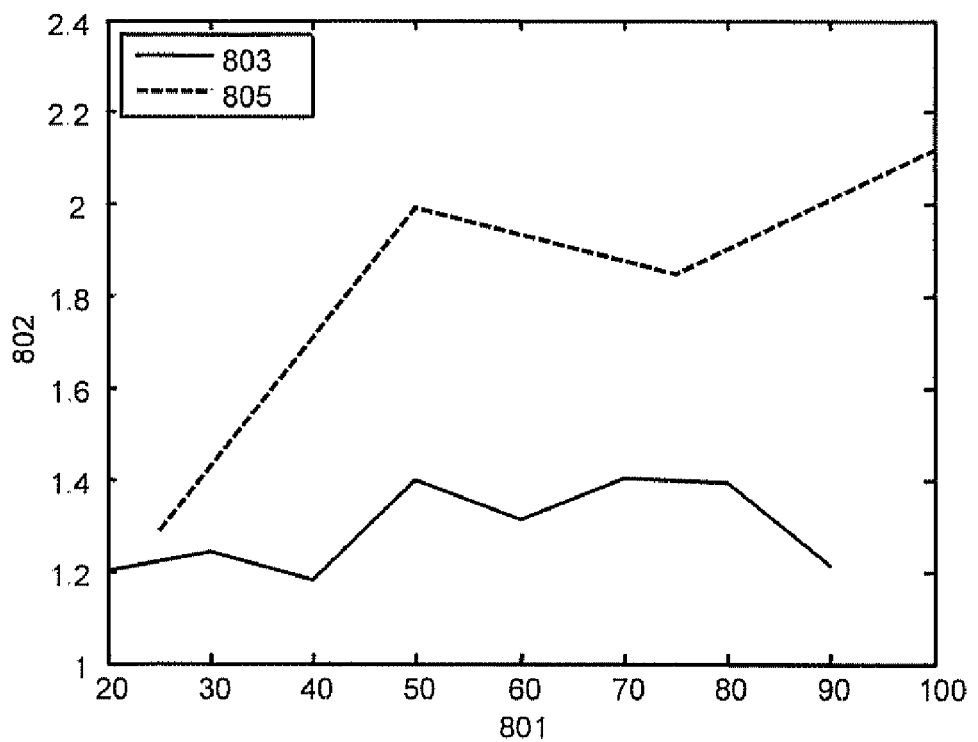
FIG. 8B is a plot of light extraction enhancement versus photonic crystal fill fraction for a pyramidal PC-LED compared to an un-patterned LED with and without micro-cavity; and, FIG. 9 is a plot of light extraction enhancement versus LED heterostructure core thickness for a pyramidal PC-LED compared to an un-patterned LED.

FIGS. 8A and 8B demonstrate the increased light extraction achievable when a photonic bandstructure is optimized with a microcavity light emitting device. In the present case a regular photonic crystal with a pitch of 500 nm and a simple reflector is compared with a pyramidal photonic crystal having the same pitch, but also possessing a microcavity reflector. In both FIGS. 8A and 8B the total light enhancement 802 is plotted as a function of photonic crystal fill fraction 801.

In FIG. 8A, solid line 803 indicates the total extraction enhancement for a photonic crystal normalized to the output from an unpatterned LED possessing a reflector. Dashed line 804, indicates the total light extraction enhancement for a photonic crystal with both a microcavity and reflector when compared to an unpatterned LED possessing a reflector. FIG. 8B highlights the increased extraction obtained as a result of the microcavity effect. Dashed line 805 shows the increased extraction effect of the photonic crystal when the microcavity is incorporated, normalized to an unpatterned LED possessing a reflector and a microcavity, as compared to solid line 803, which shows the results for the same device when normalized to those from an unpatterned LED possessing only a simple reflector. Hence the differential increase due to the combined effects is clearly visible.

Figure 9:
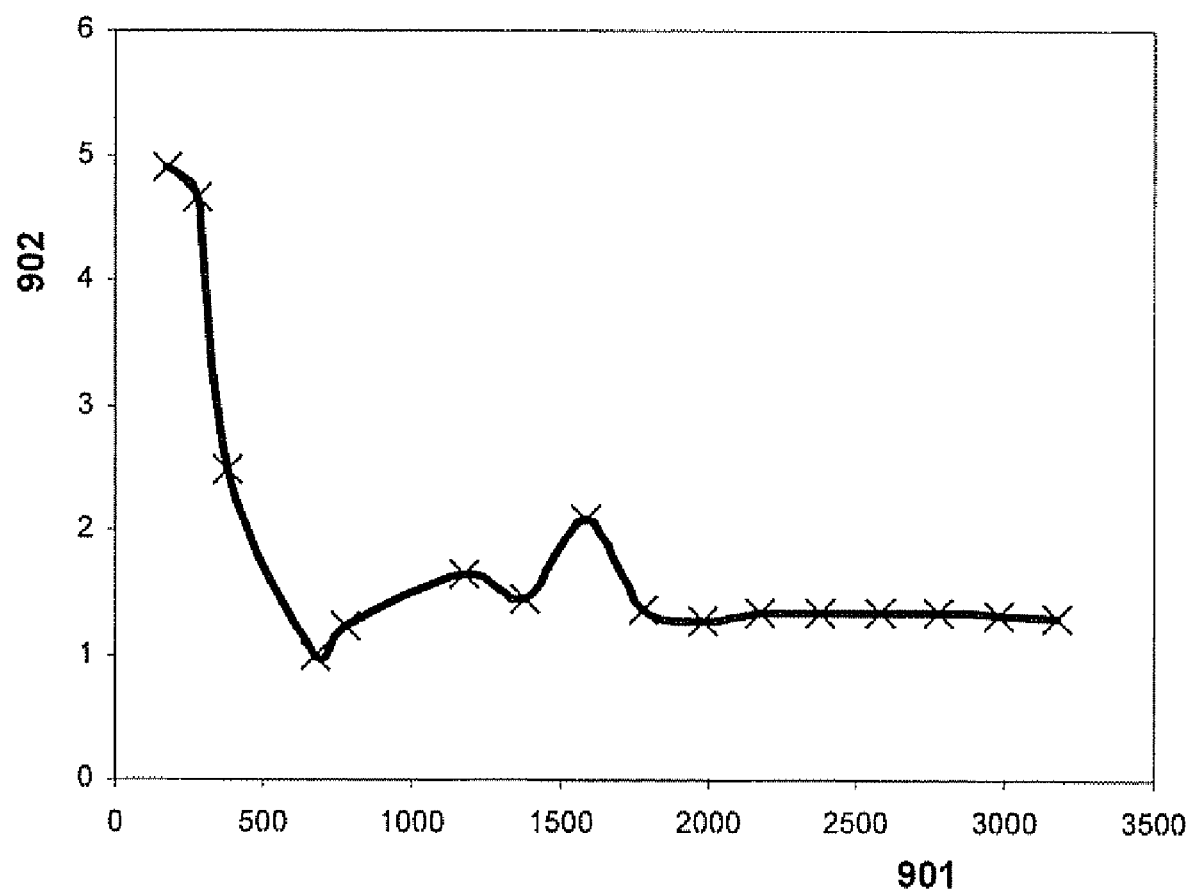

FIG. 9 illustrates the effect of reducing the thickness of a photonic bandstructure light-emitting heterostructure region. The enhancement in light extraction 902 as compared to a bare flat LED with a reflector is plotted against varying LED heterostructure core thicknesses 901 in nanometers. It is clearly visible that, as the thickness of the heterostructure is reduced, the amount of light extraction increases. In the case of the present example, the photonic crystal pattern dimensions and geometry was fixed for all heterostructure thicknesses and the microcavity effect was not employed. Hence, it becomes apparent that, for optical extraction, it is advantageous for the pyramidal structures to be etched into the heterostructure as the effective thickness of the LED is subsequently reduced.

The skilled person will appreciate that the present invention allows highly efficient and directional light emitting devices to be realized, thereby making them practical as alternative (solid-state) light sources to may existing sources. The invention lies in the careful design of pyramidal protrusions and their tiling arrangement, which gives rise to a photonic band structure that can be optimized for efficient light coupling, whilst allowing control over the propagation and far-field properties of the light emitted by the device. The practicality of the device is further enhanced by the provision of a simple patterning and etching process for fabricating the devices and which can readily be used to augment existing techniques for fabricating more conventional devices.

The invention claimed is:

1. A method for fabricating a light-emitting device (LED) comprising the steps of:
    fabricating a light-emitting device heterostructure, the device heterostructure comprising a first layer comprising a first semiconductor material having a first type of doping, a second layer comprising a second semiconductor material having a second type of doping, and a light-generating layer disposed between the first and second layers, wherein the first layer has an upper surface distal the light-generating layer and a lower surface proximate the light-generating layer and wherein light generated in the light-generating layer emerges from the LED structure through the upper surface of the first layer,
    wherein the light-emitting device heterostructure is fabricated using a flip-chip process, the flip-chip process including:
        forming the first layer on a substrate;
        forming the subsequent layers upon the first layer; and,
        removing the substrate to expose the first layer,
    forming an etch mask on the exposed first layer, the mask comprising islands of mask material at locations corresponding to a predetermined tiling arrangement, wherein the step of forming the mask comprises the steps of:
    depositing a layer of photoresist over the first layer;
    patterning the photoresist by exposure according to the predetermined tiling arrangement; and,
    removing unexposed photoresist to leave islands of photoresist at locations corresponding to the predetermined tiling arrangement;
    forming pyramidal or frustro-pyramidal projections of the first semiconductor material in the first layer at locations beneath the islands of mask material by anisotropically wet etching the first semiconductor material to a predetermined depth along predetermined crystal planes; and,
    removing the islands of mask material to leave behind the predetermined tiling arrangement of pyramidal or frustro-pyramidal projections, which in combination with a surrounding material of different refractive index comprise a photonic band structure.

2. A method according to claim 1, wherein the step of forming an etch mask further comprises the steps of:
    depositing a layer of hard mask material over the first layer before the step of depositing the layer of photoresist;
    removing hard mask material after the step of removing photoresist to leave islands of hard mask material beneath the islands of photoresist; and,
    removing the remaining islands of photoresist to leave behind the etch mask comprising the islands of hard mask material at locations corresponding to the predetermined tiling arrangement.

3. A method according to claim 1, wherein the first layer of the light-emitting device heterostructure comprises a layer of etch stop material embedded at the predetermined depth in the first semiconductor material.

4. A method according to claim 3, wherein the predetermined depth corresponds to a desired thickness for the light-emitting device.

5. A method according to claim 3, wherein the predetermined depth corresponds to a desired shape of inverted frustro-pyramidal indentation.

6. A method according to claim 1, wherein the predetermined tiling arrangement comprises a quasicrystal tiling pattern and wherein the pitch of the tiling arrangement is greater than or equal to 1.5 μm.

* * * * *